United States Patent
Chih et al.

(10) Patent No.: US 11,250,908 B2
(45) Date of Patent: Feb. 15, 2022

(54) SEGMENTED REFERENCE TRIMMING FOR MEMORY ARRAYS

(71) Applicant: Taiwan Semiconductor Manufacturing Company, Ltd., Hsinchu (TW)

(72) Inventors: Yu-Der Chih, Hsinchu (TW); Chia-Fu Lee, Hsinchu (TW); Yi-Chun Shih, Hsinchu (TW); Hon-Jarn Lin, Hsinchu (TW); Ku-Feng Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 56 days.

(21) Appl. No.: 16/544,309

(22) Filed: Aug. 19, 2019

(65) Prior Publication Data

US 2020/0066335 A1    Feb. 27, 2020

Related U.S. Application Data

(60) Provisional application No. 62/722,464, filed on Aug. 24, 2018.

(51) Int. Cl.
*G11C 11/56* (2006.01)
*G11C 11/16* (2006.01)

(52) U.S. Cl.
CPC ...... *G11C 11/5607* (2013.01); *G11C 11/1697* (2013.01)

(58) Field of Classification Search
CPC ............ G11C 11/5607; G11C 11/1697; G11C 11/1673
USPC .................................................. 365/158, 148
See application file for complete search history.

(56) References Cited

U.S. PATENT DOCUMENTS

| | | | |
|---|---|---|---|
| 8,493,776 B1 * | 7/2013 | Yu | G11C 29/74 365/158 |
| 2013/0258762 A1 * | 10/2013 | Chih | G11C 11/161 365/158 |
| 2014/0119105 A1 | 5/2014 | Jan et al. | |
| 2014/0211549 A1 * | 7/2014 | Lin | G11C 11/1675 365/158 |
| 2014/0269030 A1 * | 9/2014 | Chih | G11C 29/021 365/158 |
| 2017/0352395 A1 | 12/2017 | Jan et al. | |

\* cited by examiner

*Primary Examiner* — Connie C Yoha
(74) *Attorney, Agent, or Firm* — Merchant & Gould P.C.

(57) ABSTRACT

A method for sensing logical states of memory cells in multiple segments in a memory device, each cell having a high- and low-resistance state, resulting in different cell current levels for the different resistance states. The method includes determining target reference current levels for the respective segments, at least two of the target reference current levels being different from each other; generating a reference current for each segment with the target reference current level for that segment; comparing the cell current level for each cell to the reference current level for the segment the cell is in; and determining the logical states of the memory cells based on the comparison.

20 Claims, 7 Drawing Sheets

SEGMENTED REFERENCE TRIMMING FOR MEMORY ARRAYS

BACKGROUND

This disclosure relates generally to determining the logic state stored in a magnetic memory device, and more specifically to setting a reference parameter against which a parameter corresponding to the logic state in the memory device is compared to determine the logic state.

Certain types of memory devices, such as magnetoresistive random-access memory ("MRAM"), have two or more resistance states depending on the state of magnetization alignment between two or more layers of magnetic materials, such as ferromagnetic materials. The resistance of a memory cell can be compared to a reference resistance to determine the resistance state of the memory cell. As the density of memory cells increases, the requirement for proper setting of the reference resistance value relative to the resistance values of the memory cell becomes more stringent.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
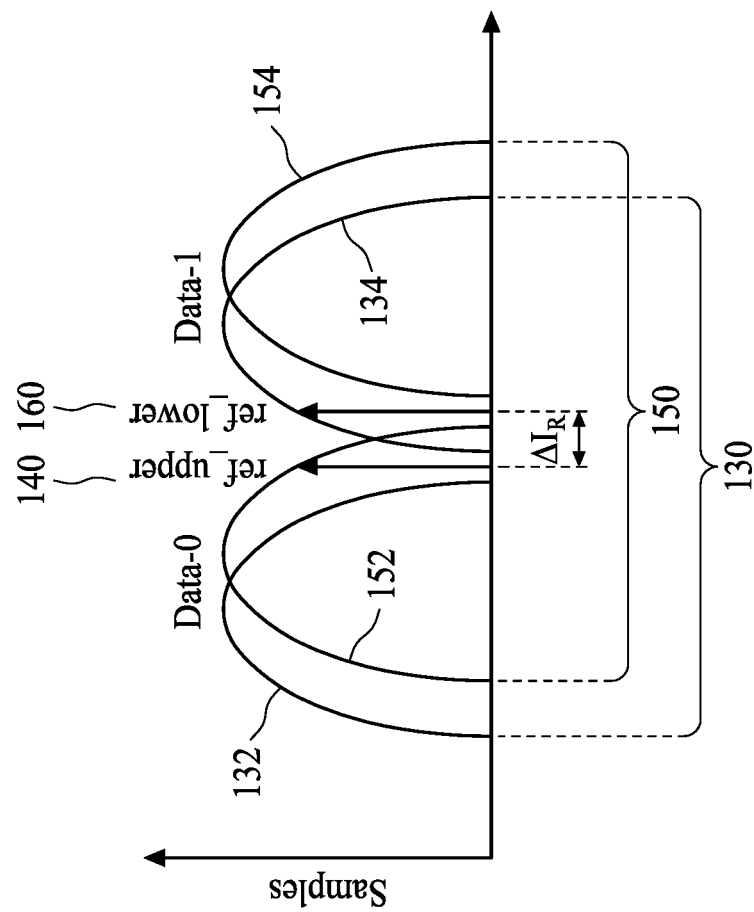
FIG. 1B shows a shows sketches of distributions of signals corresponding to high- and low-resistance states for two different virtue segments of the memory array shown in FIG. 1A, and the respective reference signals provided for the virtue segments in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

This disclosure pertains to devices and methods for providing sensing reference for determining the stored state of a parameter, such as resistance, of a magnetic memory device, such as a memory array. Such an array can be, for example, the memory cells in a memory chip. Each cell can be, for example, a magnetoresistive random access memory ("MRAM") cell, or any other device, including a memory cell, that has two or more storage states, each of which associated with a different measureable parameter.

MRAM is a non-volatile random access memory that uses magnetic storage elements to store data. MRAM stores data at memory cells having two superimposed layers of magnetic material separated by a thin insulating film. The layered structure forms a magnetic tunnel junction ("MTJ" or "MTJ element") of an MRAM cell. The two layers include a magnetic layer that is permanently magnetized in a fixed magnetic field alignment direction (this layer is referred to as a "pinned layer") and a changeably-magnetized magnetic layer (this layer is referred to as a "free layer"). The free layer can be magnetized in one of two orientations relative to the permanently magnetized layer. The two orientations are characterized by distinctly different serial resistances through the superimposed layers of the MTJ. The magnetic field orientation of the changeable layer can be aligned the same as that of the permanent magnet layer (parallel) or opposite to that of the permanent magnet layer (anti-parallel). The parallel alignment state has a relatively lower resistance and the anti-parallel alignment state has a higher resistance.

The two states of an MRAM cell can be sensed from their relatively higher or lower resistances ($R_H$ and $R_L$), which represent different binary logic values of a bit stored in the memory. For example, $R_L$ (or high cell current) may be designated as a logical "1" ("Data-1"); $R_H$ (or low cell current) may be designated as a logical "0" ("Data-0"). In certain embodiments, a reference voltage can be applied to the MRAM cell, and the resulting cell current can be used to determine whether the cell is in the low resistance state or the high resistance state. In certain embodiments, a sense amplifier can be used to compare the cell current against a reference current.

Figure 1A:
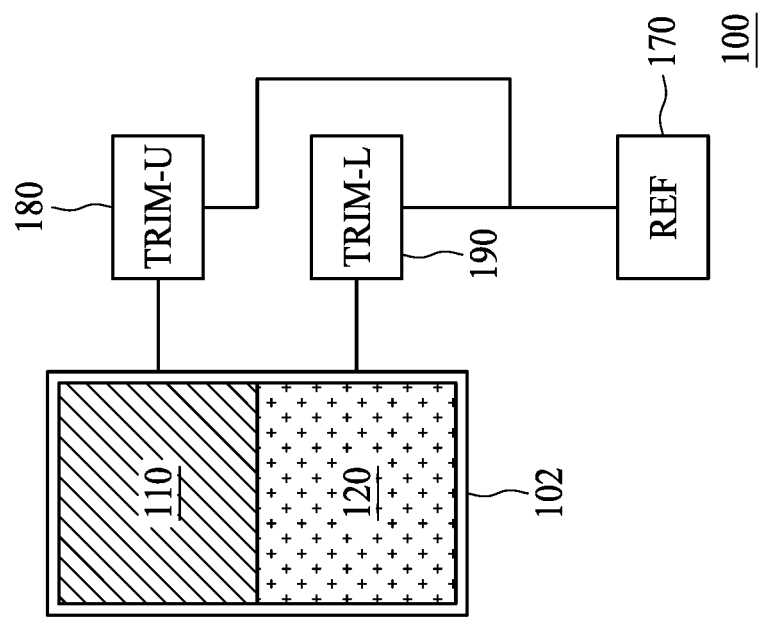
FIG. 1A shows a schematic diagram of a memory array and reference trimming circuit for the memory array in accordance with some embodiments.

With reference to FIGS. 1A and 1B, according to an embodiment, a memory device (100), such as an MRAM chip, includes an array (102) of memory cells, such as MRAM cells. The cells can be virtually divided into two or more groups. In the example shown in FIG. 1A, the array (102) is divided into two groups: an upper group (110) and a lower group (120). Here, the words "upper" and "lower" merely refer to the location of the groups in the drawing for illustrative purposes; virtual groups in actual devices can be of any shape and arranged in any spatial relationship to each other. The cell current of each cell can be compared to a reference current to determine read (sense) the logical state of the cell.

FIG. 1B shows an illustrative sketch of a cell current distribution (130) for certain memory cells, such as those in the upper segment (110). The distribution is plotted here as a histogram, with cell current (in arbitrary unit) (or any other parameter corresponding to the cell resistance) along the horizontal axis and number (or percentage) of measured currents falling within each incremental current range. Thus, in this example, the cell current for Data-0 falls within the lower-current lobe (132) of the distribution (130); the cell current for Data-1 falls within the higher-current lobe (134) of the distribution (130). A reference current (140) ("Ref_Upper") is ideally set mid-point between the two lobes (132, 134), such that a cell current lower than the reference current (140) is deemed Data-0, and a cell current higher than the reference current (140) is deemed Data-1.

Ideally, the memory cells in all segments (110,120) of the array (102) would have identical characteristics, including cell current distribution. That is, the cell current distribution (150) for the lower segment would be identical to the distribution (130) for the upper segment. However due to various reasons, including variability in the manufacturing process in making the memory device (100), certain portions (or segments) of the array (102) may have current distributions that are offset from each other. As an illustrative example, the distribution (150) for the lower segment (120), including the Data-0 lobe (152) and Data-1 lobe (154), in the example in FIG. 1B, is offset from the distribution (130) for the upper segment (110) by a finite amount (e.g., a difference in average of $\Delta I_R$). In this example, using a single reference current for the entire array (102) would result in errors in reading the resistance states of the memory cells. For example, for the example shown in FIG. 1B, using the reference current (140) for the upper segment (110) for the entire array (102) would result in some Data-0 for the lower segment (120) be read as Data-1. That is, that portion of data falling under the Data-0 lobe (152) for the lower segment (120) but corresponding to greater cell currents than Ref_Upper would be misread as Data-1.

According to some embodiments, reference trimming (adjustment) is provided, e.g., by adjusting a reference current, for each group of magnetic memory cells, such as each virtue segment in an array, each array (e.g., each memory chip), or each virtue array in multiple arrays. As an example, shown in FIG. 1B, a reference current is provided by a reference parameter generator, such as a reference current source (170) ("REF"). The reference current is trimmed by an upper-segment trim circuit (180) ("TRIM-U") to obtain an upper-segment trim reference, Ref_Upper (140); the reference current is trimmed by a lower-segment trim circuit (190) ("TRIM-L") to obtain a lower-segment trim reference (140) ("Ref_Lower"). Ref_Lower in this example is higher than Ref_Upper by the amount of the offset, $\Delta I_R$, and is thus located between the Data-0 lobe (152) and the Data-1 lobe (154) of the cell current distribution (150) for the lower segment (120). The resistance state of each segment can thus be determined with a greater degree of certainty, by comparing a cell parameter (e.g., cell currently) with the reference parameter (e.g., reference current) for the respectively segment.

Figure 6A:
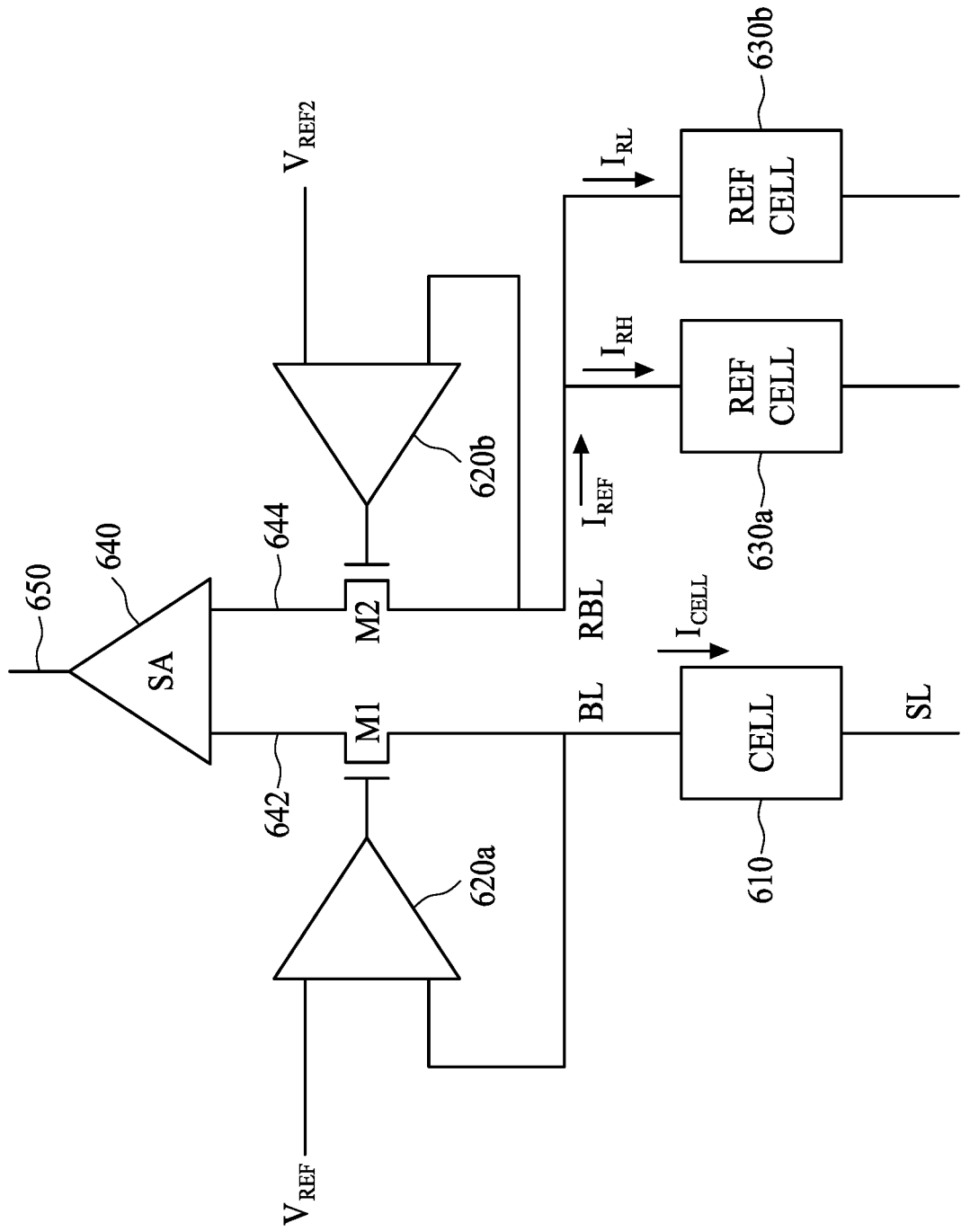
FIG. 6A shows an individual reference current trimming circuit that can be used for segmented reference trimming according to some embodiments.

Reference parameters, such as reference current, can be supplied by any suitable circuit and with any suitable method. Such circuits and methods can be found, for example, in the U.S. Pat. No. 9,165,629 B2, to Chih et al. and commonly assigned with the present application. The U.S. Pat. No. 9,165,629 B2 is incorporated herein by reference. For example, with reference to FIG. 6A, an MRAM cell 610 is coupled between a bit line BL and a supply line SL and can be in one of two states (corresponding to high resistance $R_H$ or low resistance $R_L$), such that cell 610 stores one bit of data. To sense the state of cell (610), a first reference voltage VREF is applied as shown in FIG. 6A. An amplifier (620) receiving VREF at one input terminal is provided in a feedback configuration as shown with BL coupled to another input terminal. Amplifier (620) drives an NMOS transistor M1 coupled to BL and passes a cell current $I_{CELL}$ through cell (610). $I_{CELL}$ is compared against a reference current $I_{REF}$, which is generated based on a pair of reference memory cells (630a, 630b) coupled to a reference bit line RBL. One cell in the reference pair (e.g., reference cell (630a)) is set to $R_H$, and the other (e.g., reference cell (630b)) is set to $R_L$. A second reference voltage $V_{REF2}$ is applied to each cell in the reference pair using amplifier (620b) which is provided in a feedback configuration to drive NMOS transistor M2 as shown in FIG. 6A. As a result, reference currents $I_{RH}$ and $I_{RL}$ flow through reference cells (630a, 630b) having the high and low resistances, respectively, and their sum (i.e., $I_{REF}$) is compared against $I_{CELL}$. Sense amplifier (640), which may be a mirror-type comparator, receives inputs (642, 644) and generates a sense result (650) which indicates the state of the MRAM cell (610).

Due to process variation, the resistances of reference cells (630a, 630b) may vary when those cells are set to the high and low resistance states, respectively. As a result, $I_{REF}$ may deviate from a target level. $V_{REF2}$ is trimmed (i.e., adjusted) during a testing phase (for testing the MRAM system) to compensate for such fluctuation in $I_{REF}$. As reference current $I_{REF}$ follows Ohm's law: $I_{REF}=V_{REF2}/R_{PAIR}$, where $R_{PAIR}$ is the resistance of reference pair (630a, 630b). Thus, if $R_{PAIR}$ is lower than expected, $V_{REF2}$ can be trimmed (adjusted) lower as compensation. As a result, a reliable reference current is established, increasing reliability of the sense amplifier's output (sense result 650).

Figure 6B:
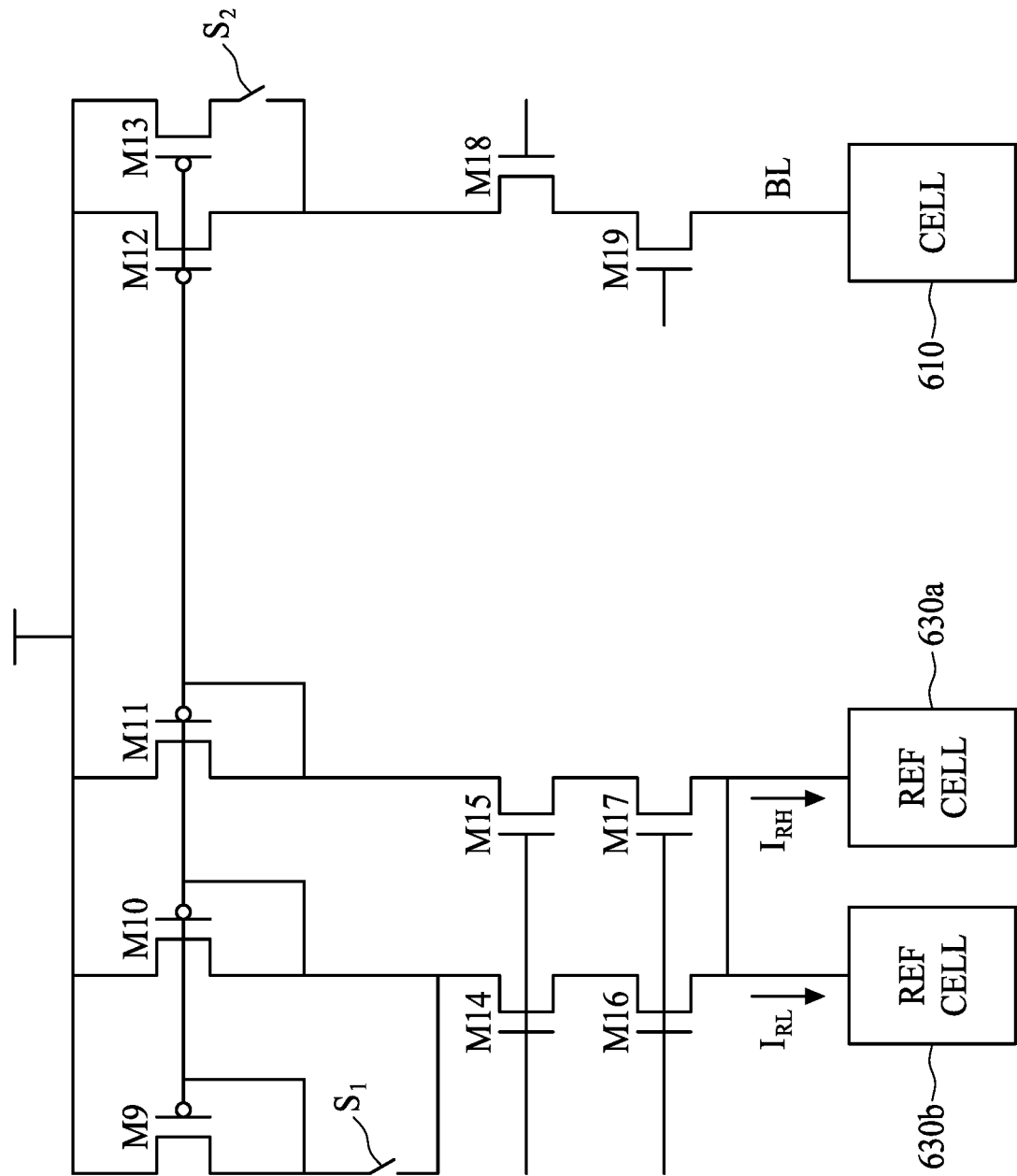
FIG. 6B shows another individual reference current trimming circuit that can be used for segmented reference trimming according to some embodiments.

An alternative circuit for reference current trimming is shown in FIG. 6B. In this example circuit, the widths of the respective transistors M9, M10, M11, M12, M13 determine the magnitude of the current conducted between source and drain terminals of each transistor and, thus, the current through each cell (630a, 630b, 610). Transistors M16, M17 and 19 are used for selecting one of various bit lines; transistors M14, M15, and M18 are used for clamping the bit line voltage. In this example, instead of adjusting a reference voltage, as shown in the example in FIG. 6A, the ratio between the reference current, $I_{REF}=I_{RL}+I_{RH}$, flowing through the reference pair (630a, 630b) and the cell current, $I_{CELL}$, flowing through the MRAM cell (610) can be trimmed (adjusted) to the expected value for the sense amplifier (640) by switching in additional current sources, such as transistors M9 and M13 (and any additional transistors) by switching devices (e.g., switching transistors) $S_1$ and $S_2$.

In FIG. 1A, the reference parameter for each virtual segment is shown as being provided by a common reference current generator (170) and the respective trim circuit (TRIM-U (170) or TRIM-L (190)). Alternatively, separate reference current generators, each with its own trim circuit, can be used to individually trim the reference currents for the upper and lower segments (110,120). In other embodiment, a variable trim circuit can be connected to all segments and provides a trimmed reference current to each segment as the segment is read. For example, the trim circuits TRIM-U (180) and TRIM-L (190) in the example show in FIG. 1B can be physically a single, variable trim circuit connected to both segments (110,120), and configured to output Ref_Upper when the upper segment (110) is being read and Ref_Lower when the lower segment (120) is being read.

Figure 2:
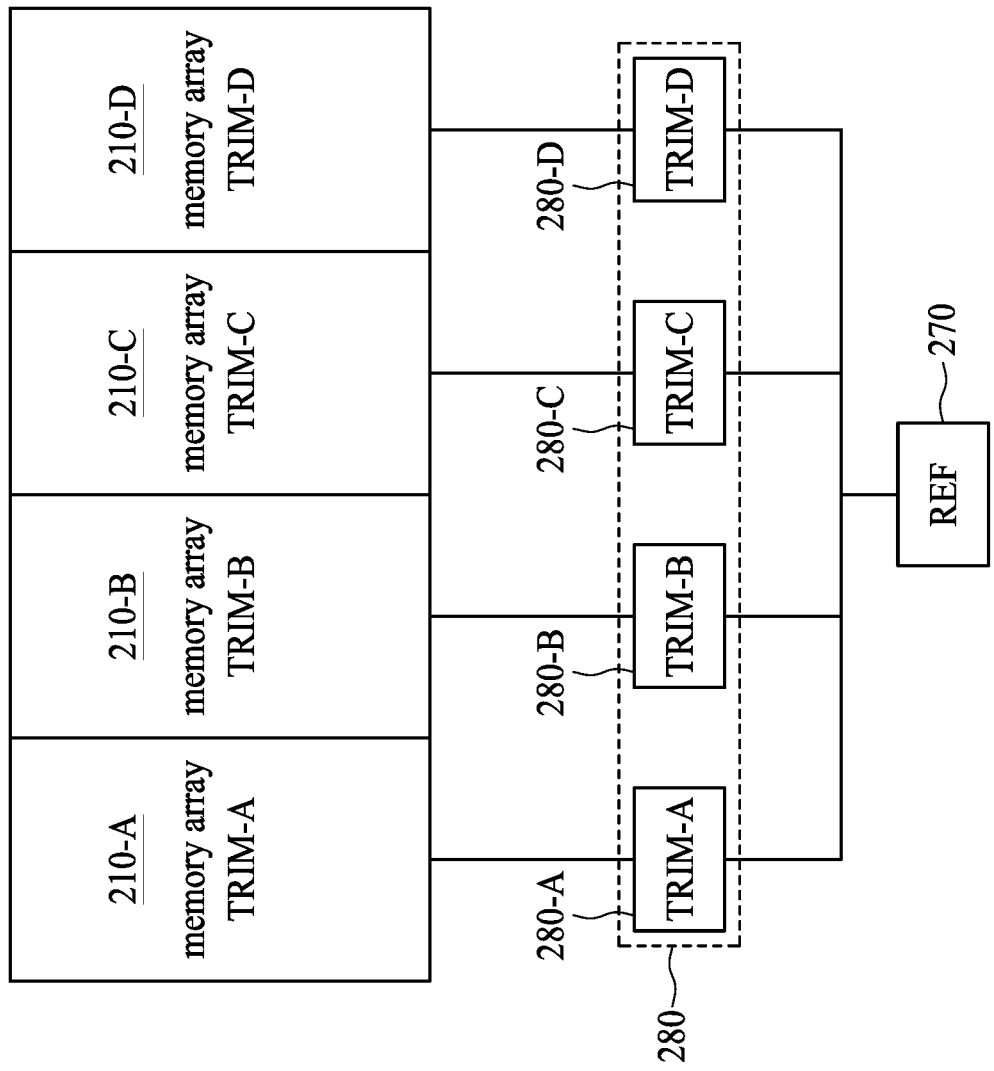
FIG. 2 schematically shows multiple memory arrays and reference trimming provided for the respective arrays in accordance with some embodiments.

The segmented (or individualized) approach for reference trimming, i.e., applying reference parameters (such as reference currents) appropriate for the respective memory cells or groups of memory cells, can be used for any grouping, physical or virtual, of memory cells. For example, with reference to FIG. 2, in accordance with certain other embodiments, reference currents for physically distinct memory arrays (210-A, 210-B, 210-C, 210-D) in a memory device (200) can be differently trimmed. In this example, a reference parameter (e.g., current) generated by a reference current generator (270) ("REF") is trimmed by trim circuits TRIM-A (280-A), TRIM-B (280-B), TRIM-C (280-C) and TRIM-D (280-D) for the respective memory arrays (210-A, 210-B, 210-C, 210-D). In an alternative example, a single trim circuit (280) may be used to variably trim reference parameter and apply an appropriately trimmed reference parameter to each memory array as that array is read.

Figure 3:
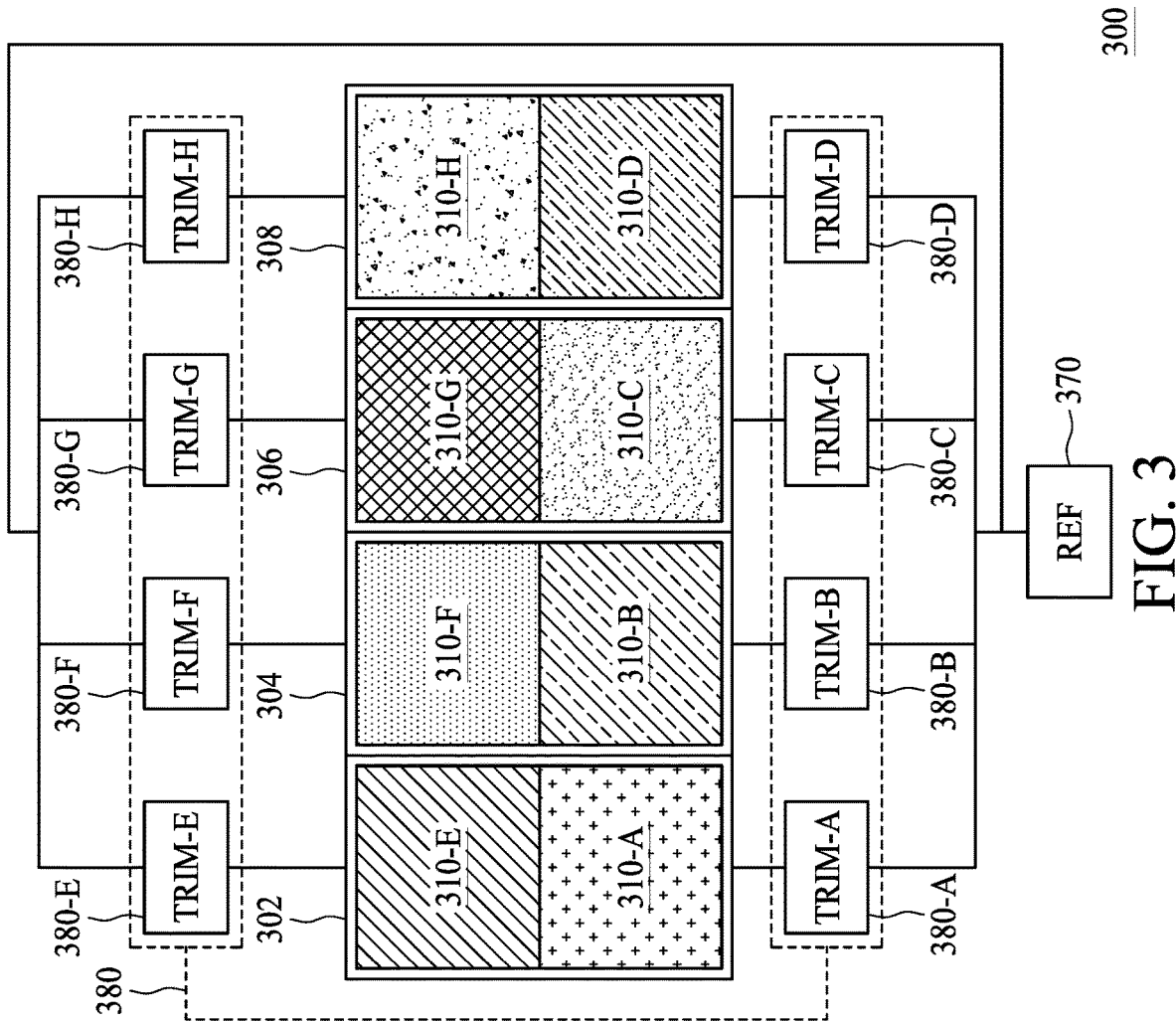
FIG. 3 schematically shows multiple memory arrays, each with multiple virtual segments, and reference trimming provided for each of the respective virtual segments in accordance with some embodiments.

As another example, with reference to FIG. 3, memory arrays (302, 304, 306, 308) of the memory device (300) can each have virtual segments (310-A and 310-E in array (302), 310-B and 310-F in array (304), 310-C and 310-G in array (306), and 310-D and 310-H in array (308) in this example) that have their respective mid-points between Data-0 and Data-1 offset from each other. The reference parameter generated by the reference current generator (370) can be individually trimmed to have the reference parameter set to the mid-point for each segment by the corresponding trim circuits (380-A, 380-B, 380-C, 380-D, 380-E, 380-F, 380-G, 380-H). In an alternative example, a single trim circuit (380) may be used to variably trim reference parameter and apply an appropriately trimmed reference parameter to each segment of the arrays as that segment is read.

Figure 4:
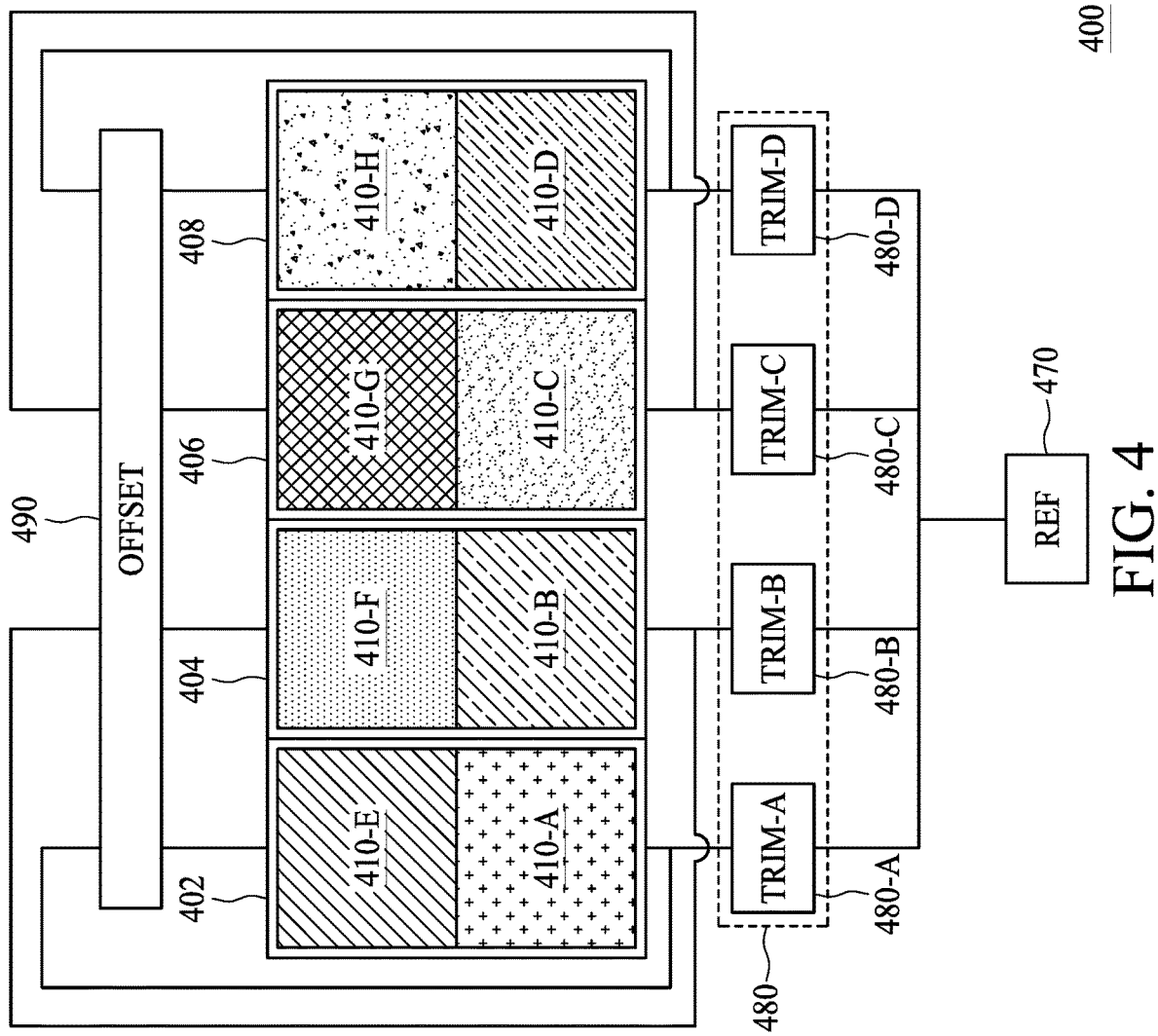
FIG. 4 schematically shows multiple memory arrays, each with multiple virtual segments, with some of the virtual segments sharing the same trimming offset, and reference trimming provided for each of the respective virtual segments in accordance with some embodiments.

In certain embodiments, there may be instances in which, for multiple memory arrays, the relative offset between the mid-points between Data-0 and Data-1 for two virtual segments of each array is substantially the same among the arrays. In such cases, a fixed offset trim can be applied between two segments for all arrays. With reference to FIG. 4, in an example embodiment, memory arrays (402, 404, 406, 408) of the memory device (400) can each have virtual segments (410-A and 410-E in array (402), 410-B and 410-F in array (404), 410-C and 410-G in array (306), and 410-D and 410-H in array (408) in this example). The offset between the mid-points between Data-0 and Data-1 for the two virtual segments (e.g., between upper and lower segments) of each array is the same for all arrays, and there can be overall offsets among the arrays. That is, there can be offsets among the segment 410-A, 410-B, 410-C and 410-D. In this example, trim circuits (480-A, 480-B, 480-C, 480-D), or a variable trim circuit (480) can be used to trim the reference parameter generated by the reference current generator 470 and apply the trimmed reference parameters to the respective lower segments (410-A, 410-B, 410-C and 410-D). In addition, a fixed offset trim circuit 490 is connected between the trim circuits (480-A, 480-B, 480-C, 480-D) or a variable trim circuit (480), and the respective upper segments (410-E, 410-F, 410-G, 410-H)

Figure 5:
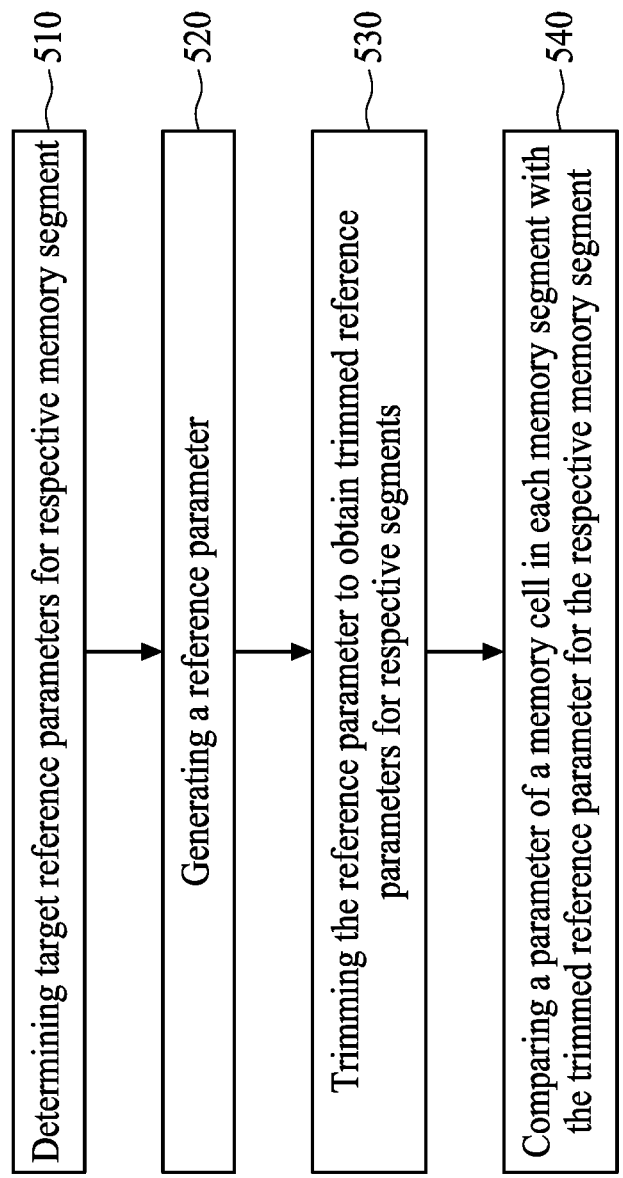
FIG. 5 outlines a method of reference trimming for a memory device according some embodiments.

The example arrangements described above can be used to provide reference parameters individualized for each segment, whether a virtual segment as a part of an array or an array itself, for sensing the logical state of the memory cells in the segment. In an example embodiment, as outlined in FIG. 5, a method (500) for sensing logical states of memory cells includes determining (510) target reference parameters, such as reference currents for respective memory segments. For example, MRAM cell resistance for Data-0 and Data-1 states for each segment can be measured a number of times, for example, in the form of cell current under a known bias voltage to ascertain a resistance or current distribution, similar to those (130, 150) shown in FIG. 1B. The mid-point between the Data-0 and Data-1 values (e.g., mid-point between peak Data-0 value and peak Data-1 value, or between average Data-0 value and average Data-1 value) can be chosen as the target reference parameter.

Next, a reference parameter, such as a reference current, can be generated (520). The value of the reference parameter can be chosen, for example, to be within the trimming capabilities of the trim circuits, i.e., at a level from which the trim circuits are capable of adjusting the reference parameter to a level mid-point between peak Data-0 value and peak Data-1 value. It can be, for example, the maximum target reference parameter or a value slightly higher than the target reference parameter (if trimming is performed by reducing the reference parameter).

The reference parameter is then trimmed (adjusted) (530) to obtain trimmed reference parameters for the respective segments, at least two of the trimmed reference parameter being different from each other. For example, the trimmed reference parameters can be the target reference parameters for the respective segments. Trimming can be performed in any suitable manner. For example, it can be done by individual trim circuits, one for each segment; or it can be done by a single variable trim circuit, which supplies trimmed reference parameters to multiple segments, with the target reference parameter for a particular segment supplied then memory cells in that segment are being read.

Finally, the sensing is accomplished by comparing (540) the cell parameters, such as the currents through MRAM cells, of memory cells in the segments to the respective trimmed (e.g., target) reference parameters, such as reference currents for the respective segments.

As a result, each segment of memory has a segment-specific reference parameter (e.g., resistance or current) to compare with the cell parameters in that segment. Thus, in situations in which regions (virtual segments or arrays) of memory cells have any systematic shift, or offset, relative to other regions of memory, reference parameters can be positioned substantially at the center of Data-0 and Data-1.

Thus, the embodiments disclosed herein provide improved reliability in sensing logic states of memory cells in memory devices such as MRAMs. Such an improvement is particularly beneficial as cell density in magnetic memory devices increases, leading to smaller Data-0/Data-1 separation and relatively more significant offsets among segments due to process variations.

One embodiment is a method for sensing logical states of memory cells in multiple memory segments, each having at least one memory cell, and the logical state of each cell is correlated to the value of a parameter associated with the cell. The method includes determining target reference parameter values, each for a respective one of the memory segments. At least two of the target reference parameter values are different from each other. The method also includes generating reference parameters, each associated with a respective one of the memory segments and having the target reference parameter value for the memory segment. The method further includes comparing the value of the parameter associated with at least one memory cell from each of the memory segments to the reference parameter value for the memory segment, and determining the logical states of the memory cells in the memory segments based on the comparison.

Another embodiment is a memory device, which includes a first set of memory cells; a second set of memory cells, where each of the first and second groups of memory cells are switchable between two states and have a parameter associated with the cell, the parameter having two values corresponding respectively to the two states. The memory device also includes a reference parameter generator configured to supply a first reference parameter to the first set of memory cells and a second reference parameters to the second set of memory cells, where the first and second reference parameters have different values. The memory device further includes a comparator configured to compare the parameters associated with each of the first set of memory cells with the first reference parameter, and to compare the parameters associated with each of the second set of memory cells with the second reference parameter.

A further embodiment is a magnetoresistive random-access memory (MRAM) device, which includes a first set of MRAM cells and a second set of MRAM cells, each of the MRAM cells having a high-resistance state and a low-resistance state. The MRAM device also includes a voltage supply line adapted to apply a voltage to each of the MRAM cells to cause a current to flow through the MRAM cell. The MRAM device further includes a reference current generator configured to provide a first reference current and second reference current, the first and second reference currents having different magnitudes. The MRAM device further includes a comparator configured to compare the current flowing through each of the first set of MRAM cells with the first reference current, and to compare the current flowing through each of the second set of MRAM cells with the second reference current, and to output a signal indicative of the resistance state of the MRAM cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for sensing logical states of memory cells in a plurality of memory segments, the method comprising:
   determining a plurality of target reference parameter values, each for a respective one of a plurality of memory segments, each comprising a plurality of memory cells, the logical state of each of the plurality of cells being correlated to the value of a parameter associated with the cell, at least two of the plurality of target reference parameter values being different from each other;
   generating a plurality of reference parameters, each associated with a respective one of the memory segments and having the target reference parameter value for the memory segment;
   comparing the values of the parameter associated with the plurality of memory cells from each of the memory segments to the reference parameter value for the memory segment; and
   determining the logical states of the memory cells in the plurality of memory segments based on the comparison.

2. The method of claim 1, wherein generating a plurality of reference parameters comprises:
   generating a first reference parameter; and
   obtaining the plurality of reference parameters based on the first reference parameter.

3. The method of claim 2, wherein the plurality of reference parameters comprises using a plurality of trim circuits to trim the first reference parameter to obtain the respective plurality of reference parameters.

4. The method of claim 2, wherein obtaining the plurality of reference parameter comprises using a trim circuit to sequentially trim the first reference parameter to obtain the plurality of reference parameters.

5. The method of claim 1, wherein each of the reference parameters is a reference current, and wherein the parameter associated with each memory cell is a current through the memory cell.

6. The method of claim 2, wherein obtaining the plurality of reference parameters comprises:
   trimming the first reference parameter to obtain a first subset of the plurality of reference parameters; and
   trimming the first subset of the plurality of the reference parameters to obtain a second subset of the reference parameters.

7. The method of claim 6, wherein:
   trimming the first reference parameter to obtain a first subset of the plurality of reference parameters comprises trimming the first reference parameter to obtain a first subset of the plurality of reference parameters of at least two different values; and
   trimming the first subset of the plurality of the reference parameters to obtain a second subset of the reference parameters comprises trimming the first subset of the plurality of the reference parameters by the same amount.

8. The method of claim 1, wherein determining a plurality of target reference parameter values comprises, for each of the plurality of segments:
   obtaining values of the parameters associated with at least one memory cell in the memory segment with the at least one memory cell set in each of the logical states; and
   setting as the target reference parameter value a value between the values of the parameters associated with at least one memory cell being in a first logical state and the values of the parameters associated with at least one memory cell being in a second logical state.

9. The method of claim 1, wherein the plurality of memory segments comprise a plurality of virtual memory segments in a magnetic memory chip.

10. The method of claim 2, wherein the generating the plurality of reference parameters comprises generating a first subset of the plurality of reference parameters, the first subset of the plurality of reference parameters including two or more of the plurality of the reference parameters, and adding a fixed offset trim to the first subset of the plurality of reference parameters to generate a second subset of the plurality of the reference parameters.

11. A memory device, comprising,
a first plurality of memory cells;
a second plurality of memory cells,
   each of the first and second plurality of memory cells being switchable between two states and having a parameter associated with the cell, the parameter having two values corresponding respectively to the two states;
a reference parameter generator configured to supply a first reference parameter to the first plurality of memory cells and a second reference parameters to the second plurality of memory cells, the first and second reference parameters having different values; and
a comparator configured to compare the parameters associated with each of the first plurality of memory cells with the first reference parameter, and to compare the parameters associated with each of the second plurality of memory cells with the second reference parameter.

12. The memory device of claim 11, wherein the first plurality of memory cells form a first virtual segment in a magnetic memory chip, and the second plurality of memory cells form a second virtual segment in a magnetic memory chip.

13. The memory device of claim 11, where the first plurality of memory cells are located in a first magnetic memory chip, and the second plurality of memory cells are located in a second magnetic memory chip.

14. The memory device of claim 11, wherein the reference parameter generator comprises:
a first reference parameter generator configured to generate a first reference parameter; and
a trim circuit adapted to adjust modify the first reference parameter to obtain the first and second reference parameters.

15. The memory device of claim 11, further comprising:
a third plurality of memory cells;
a fourth plurality of memory cells; and
an offset circuit configured to provide to the third plurality of memory cells a third reference parameter having a value differing from the value of the first reference parameter by an offset amount, and to provide to the fourth plurality of memory cells a fourth reference parameter having a value differing from the value of the second reference parameter by the offset amount.

16. A Magnetoresistive random-access memory (MRAM) device, comprising:
a first plurality of MRAM cells;
a second plurality of MRAM cells,
   each of the MRAM cells having a high-resistance state and a low-resistance state;
a voltage supply line adapted to apply a voltage to each of the MRAM cells to cause a current to flow through the MRAM cell;
a reference current generator configured to provide a first reference current and second reference current, the first and second reference currents having different magnitudes; and
a comparator configured to compare the current flowing through each of the first plurality of MRAM cells with the first reference current, and to compare the current flowing through each of the second plurality of MRAM cells with the second reference current, and to output a signal indicative of the resistance state of the MRAM cell.

17. The MRAM device of claim 16, wherein the first and second pluralities of MRAM cells are parts of an MRAM array in an MRAM chip.

18. The MRAM device of claim 16, wherein the first plurality of MRAM cells are formed in a first MRAM chip, and the second plurality of MRAM cells are formed in a second MRAM chip.

19. The MRAM device of claim 16, wherein the reference current generator comprises a current generator and a current trimming circuit configured to adjust the current generated by the current generator to obtain the first reference current and second reference current.

20. The MRAM device of claim 19, further comprising an offset circuit configured to provide a reference current offset from both the first reference current and second reference current by a same amount,
the MRAM device further comprising a third plurality of MRAM cells and fourth plurality of MRAM cells, each of the MRAM cells having a high-resistance state and a low-resistance state,
the voltage supply line further adapted to apply the voltage to each of the MRAM cells in the third and fourth pluralities of MRAM cells to cause a current to flow through the MRAM cell,
the comparator further configured to compare the current flowing through each of the third plurality of MRAM cells with the third reference current, and to compare the current flowing through each of the fourth plurality of MRAM cells with the fourth reference current, and to output a signal indicative of the resistance state of the MRAM cell.

* * * * *